(12) United States Patent
Chang et al.

(10) Patent No.: US 10,211,211 B1
(45) Date of Patent: Feb. 19, 2019

(54) METHOD FOR FABRICATING BURIED WORD LINE OF A DYNAMIC RANDOM ACCESS MEMORY

(71) Applicants: UNITED MICROELECTRONICS CORP., Hsin-Chu (TW); Fujian Jinhua Integrated Circuit Co., Ltd., Quanzhou, Fujian Province (CN)

(72) Inventors: Kai-Jiun Chang, Taoyuan (TW); Yi-Wei Chen, Taichung (TW); Tsun-Min Cheng, Changhua County (TW); Chia-Chen Wu, Nantou County (TW); Pin-Hong Chen, Tainan (TW); Chih-Chieh Tsai, Kaohsiung (TW); Tzu-Chieh Chen, Pingtung County (TW); Yi-An Huang, New Taipei (TW)

(73) Assignees: UNITED MICROELECTRONICS CORP., Hsin-Chu (TW); Fujian Jinhua Integrated Circuit Co., Ltd., Quanzhou, Fujian Province (CN)

(*) Notice: Subject to any disclaimer, the term of this patent is extended or adjusted under 35 U.S.C. 154(b) by 30 days.

(21) Appl. No.: 15/830,006

(22) Filed: Dec. 4, 2017

(30) Foreign Application Priority Data

Nov. 6, 2017 (CN) .......................... 2017 1 1079388

(51) Int. Cl.
| | | |
|---|---|---|
| *H01L 29/423* | (2006.01) |
| *H01L 29/49* | (2006.01) |
| *H01L 29/778* | (2006.01) |
| *H01L 29/45* | (2006.01) |
| *H01L 21/768* | (2006.01) |
| *H01L 21/3205* | (2006.01) |
| *H01L 21/4763* | (2006.01) |
| *H01L 27/108* | (2006.01) |
| *H01L 23/532* | (2006.01) |

(Continued)

(52) U.S. Cl.
CPC .. *H01L 27/10891* (2013.01); *H01L 21/02068* (2013.01); *H01L 21/76852* (2013.01); *H01L 21/76895* (2013.01); *H01L 23/535* (2013.01); *H01L 23/53266* (2013.01)

(58) Field of Classification Search
CPC . C23C 16/34; C23C 16/45527; C23C 16/045; C23C 16/45525; C23C 16/56; H01L 21/28562; H01L 21/28088; H01L 29/4236; H01L 29/4966; H01L 29/66621
See application file for complete search history.

(56) References Cited

U.S. PATENT DOCUMENTS 9,177,826 B2   11/2015   Hintze et al.
9,236,439 B2   1/2016    Jeong
(Continued)

OTHER PUBLICATIONS

"Molecular Orbital Studies of Titanium Nitride Chemical Vapor Deposition: Imido Dimer Formation and Elimination Reactions", Cross, et al., Chem. Mater. 2001, 13, p. 1095-1100 (Year: 2001).*

(Continued)

*Primary Examiner* — Brian Turner
(74) *Attorney, Agent, or Firm* — Winston Hsu

(57) ABSTRACT

A method for fabricating a buried word line (BWL) of a dynamic random access memory (DRAM) includes the steps of: forming a trench in a substrate; forming a barrier layer in the trench; performing a soaking process to reduce chlorine concentration in the barrier layer; and forming a conductive layer to fill the trench.

6 Claims, 4 Drawing Sheets

(51) Int. Cl.
    *H01L 21/02*     (2006.01)
    *H01L 23/535*    (2006.01)

(56) References Cited

U.S. PATENT DOCUMENTS

| | | | | |
|---|---|---|---|---|
| 2006/0234502 A1* | 10/2006 | Bhat | ................ | H01L 21/28088 |
| | | | | 438/656 |
| 2008/0057344 A1* | 3/2008 | Murakami | .............. | C23C 16/34 |
| | | | | 428/698 |
| 2008/0274624 A1* | 11/2008 | Hasegawa | ............... | C23C 16/34 |
| | | | | 438/765 |
| 2011/0244673 A1* | 10/2011 | Cho | ...................... | C23C 16/045 |
| | | | | 438/589 |
| 2012/0153381 A1* | 6/2012 | Song | ................. | H01L 27/10876 |
| | | | | 257/330 |

OTHER PUBLICATIONS

"Studies on the Behuviour of Halides of the Transition Metals with Ammonia. Part II: The Reaction of Titanium Tetrachloride with Ammonia", Fowles et al., J. Chem. Soc., 1952,0, p. 2588-2593 (Year: 1952).*

"Theoretical ab initio Study of TiCl4 Ammonolysis: Gas Phase Reactions of TiN Chemical Vapor Deposition", Siodmiak et al., J. Mol. Model. 2000, 6, p. 413-424 (Year: 2000).*

"Thermodynamics and Kinetics of Initial Gas Phase Reactions in Chemical Vapor Deposition of Titanium Nitride. Theoretical Study of TiCl4 Ammonolysis", Umanskii et al., Journal of Computational Chemistry, vol. 22, No. 13, p. 1366-1376 (2001) (Year: 2001).*

\* cited by examiner

METHOD FOR FABRICATING BURIED WORD LINE OF A DYNAMIC RANDOM ACCESS MEMORY

BACKGROUND OF THE INVENTION

1. Field of the Invention

The invention relates to a method for fabricating semiconductor device, and more particularly to a method for fabricating buried word line (BWL) of a dynamic random access memory (DRAM) device.

2. Description of the Prior Art

As electronic products develop toward the direction of miniaturization, the design of dynamic random access memory (DRAM) units also moves toward the direction of higher integration and higher density. Since the nature of a DRAM unit with buried gate structures has the advantage of possessing longer carrier channel length within a semiconductor substrate thereby reducing capacitor leakage, it has been gradually used to replace conventional DRAM unit with planar gate structures.

Typically, a DRAM unit with buried gate structure includes a transistor device and a charge storage element to receive electrical signals from bit lines and word lines. Nevertheless, current DRAM units with buried gate structures still pose numerous problems due to limited fabrication capability. Hence, how to effectively improve the performance and reliability of current DRAM device has become an important task in this field.

SUMMARY OF THE INVENTION

According to an embodiment of the present invention, a method for fabricating a buried word line (BWL) of a dynamic random access memory (DRAM) includes the steps of: forming a trench in a substrate; forming a barrier layer in the trench; performing a soaking process to reduce chlorine concentration in the barrier layer; and forming a conductive layer to fill the trench.

According to an embodiment of the present invention, the formation of the barrier layer preferably includes reacting a first reagent containing titanium with a second reagent containing nitrogen to form a barrier layer made of titanium nitride (TiN) and a byproduct containing $Ti(NH_2)_xCl_y$. Next, a soaking process is conducted thereafter to remove the byproduct for improving adhesion between the barrier layer and the conductive layer and at the same time lowering resistance of the device.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
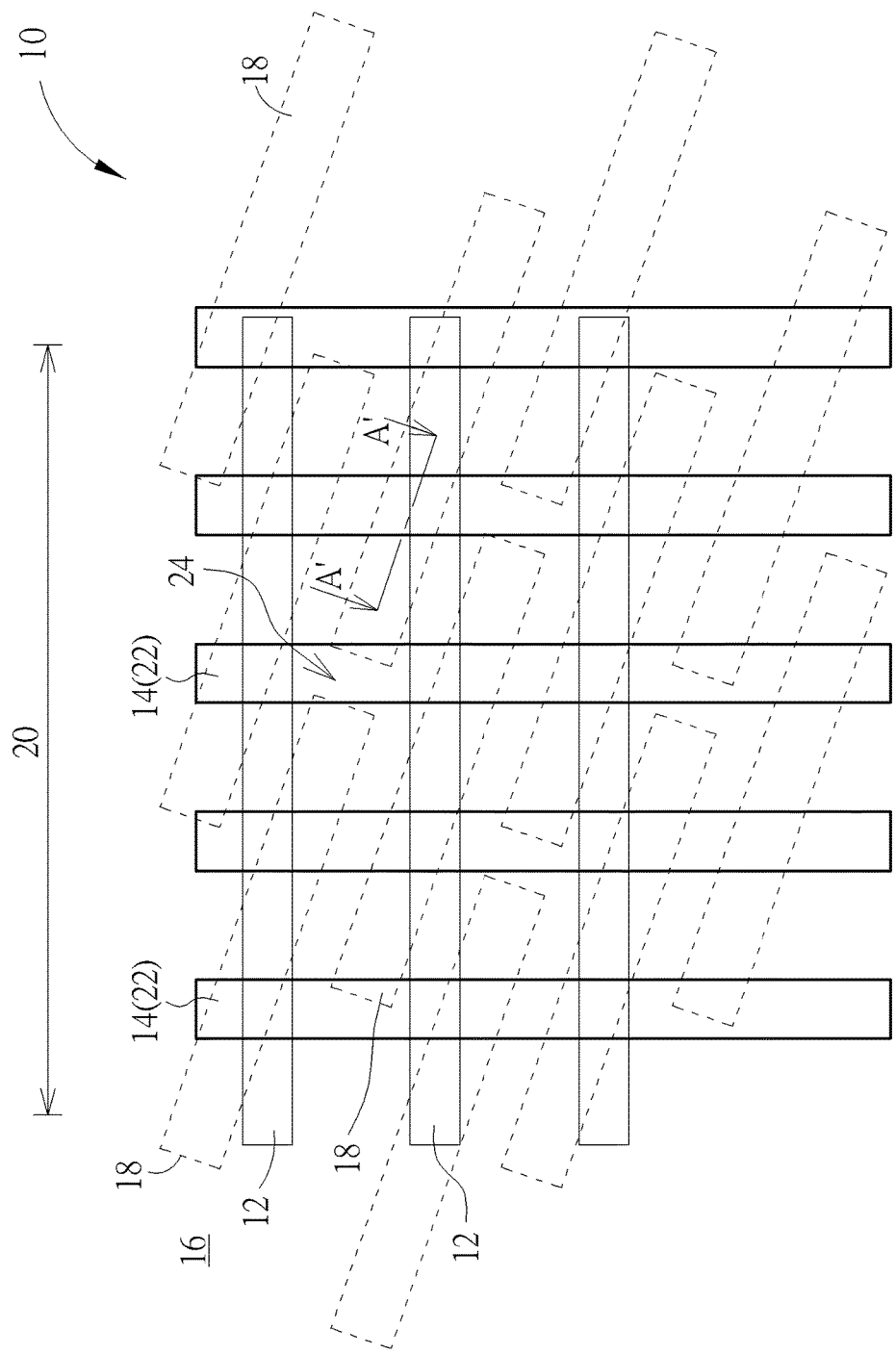
FIGS. 1-6 illustrate a method for fabricating a DRAM device according to an embodiment of the present invention.

Referring to FIGS. 1-6, FIGS. 1-6 illustrate a method for fabricating a DRAM device according to an embodiment of the present invention, in which FIG. 1 illustrates a top-view diagram of a DRAM device and FIGS. 2-6 illustrate cross-sectional views of a method for fabricating a buried word line (BWL) of the DRAM device along the sectional line AA' of FIG. 1. Preferably, the present embodiment pertains to fabricate a memory device, and more particularly a DRAM device 10, in which the DRAM device 10 includes at least a transistor device (not shown) and at least a capacitor structure (not shown) that will be serving as a smallest constituent unit within the DRAM array and also used to receive electrical signals from bit lines 12 and word lines 14.

As shown in FIG. 1, the DRAM device 10 includes a substrate 16 such as a semiconductor substrate or wafer made of silicon, a shallow trench isolation (STI) 24 formed in the substrate 16, and a plurality of active areas (AA) 18 defined on the substrate 16. A memory region 20 and a periphery region (not shown) are also defined on the substrate 16, in which multiple word lines 14 and multiple bit lines 12 are preferably formed on the memory region 20 while other active devices (not shown) could be formed on the periphery region. For simplicity purpose, only devices or elements on the memory region 20 are shown in FIG. 1 while elements on the periphery region are omitted.

In this embodiment, the active regions 18 are disposed parallel to each other and extending along a first direction, the word lines 14 or multiple gates 22 are disposed within the substrate 16 and passing through the active regions 18 and STI 24. Preferably, the gates 22 are disposed extending along a second direction, in which the second direction crosses the first direction at an angle less than 90 degrees.

The bit lines 12 on the other hand are disposed on the substrate 16 parallel to each other and extending along a third direction while crossing the active regions 18 and STI 24, in which the third direction is different from the first direction and orthogonal to the second direction. In other words, the first direction, second direction, and third direction are all different from each other while the first direction is not orthogonal to both the second direction and the third direction. Preferably, contact plugs such as bit line contacts (BLC) (not shown) are formed in the active regions 18 adjacent to two sides of the word lines 14 to electrically connect to source/drain region (not shown) of each transistor element and storage node contacts (not shown) are formed to electrically connect to a capacitor.

Figure 2:
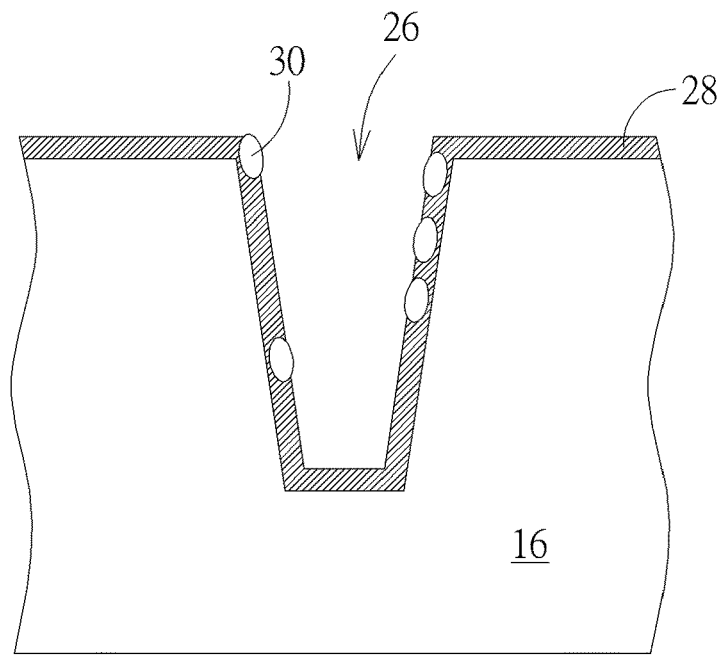

The fabrication of word lines 14 (or also referred to as buried word lines) is explained below. As shown in FIG. 2, at least a trench 26 is formed in the substrate 16 and then a gate dielectric layer (not shown) and a barrier layer 28 are formed sequentially in the trench 26 and on the substrate 16. In this embodiment, the formation of the barrier layer 28 preferably involves reacting a first reagent containing titanium with a second reagent containing nitrogen. More specifically, the barrier layer 28 is formed by reacting a first reagent such as $TiCl_4$ with a second reagent such as $NH_3$ to forma barrier layer 28 made of titanium nitride (TiN) and HCl.

It should be noted that during the formation of the barrier layer 28, byproduct 30 made of $Ti(NH_2)_xCl_y$ is often produced as a result of incomplete reaction between the aforementioned first reagent and the second reagent. In essence, the incomplete reaction between the first reagent and the second reagent induces condensation of chlorine and causes the formation of the byproduct 30 containing $Ti(NH_2)_xCl_y$. Since the formation of the byproduct 30 on the surface of the barrier layer 28 easily impairs the adhesion between barrier layer 28 and conductive layer formed afterwards, a soaking process is preferably conducted after the formation of the barrier layer 28 to remove the byproduct 30 and at the same time lower the concentration of chlorine on the surface of the barrier layer 28.

In this embodiment, the soaking process is accomplished by first conducting an in-situ ammonia ($NH_3$) soaking process to react $NH_3$ with the aforementioned byproduct 30, and then conduct a $N_2$ purge process to remove HCl formed by the byproduct 30 further reacting with $NH_3$.

Figure 3:
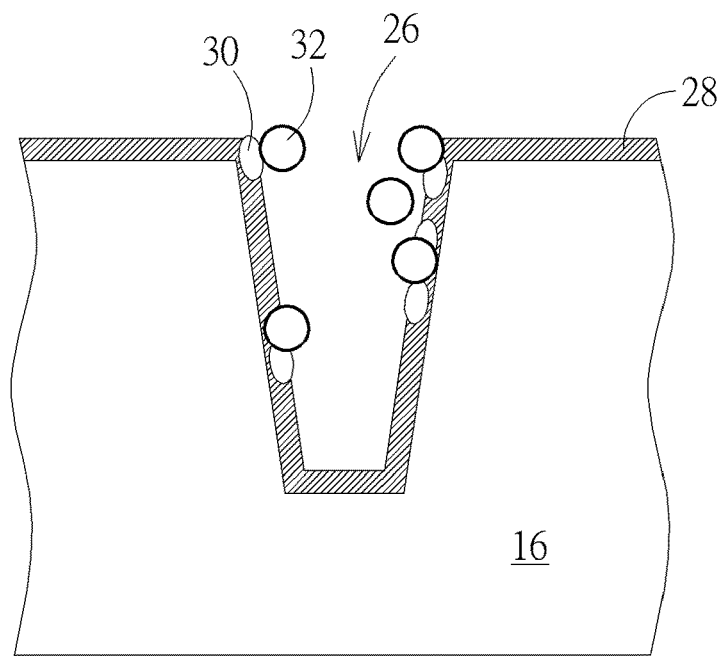

As shown in FIG. 3, it would be desirable to first conduct an in-situ $NH_3$ soaking process by introducing or injecting ammonia gas ($NH_3$) 32 within the same reaction chamber so that ammonia 32 could react and combine with the byproduct 30 to form TiN and HCl.

Figure 4:
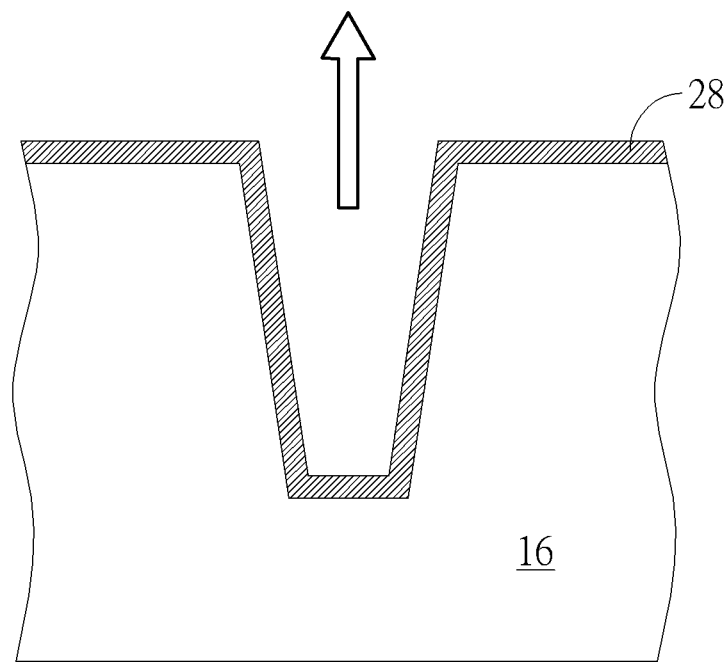

Next, as shown in FIG. 4, a $N_2$ purge process is conducted by using nitrogen gas as a medium to purge or remove the HCl from the reaction chamber according to the direction of the arrow. This reduces the concentration of chlorine on the surface of the barrier layer 28 so that no more byproduct 30 is adhered onto the surface of the barrier layer 28.

It should be noted that the aforementioned two steps conducted from FIGS. 3-4 are preferably viewed as a single soaking process cycle and according to an embodiment of the present invention, 10 soaking cycles or more are preferably conducted after the barrier layer 28 made of TiN is formed so that no additional byproduct 30 is remained on the surface of the barrier layer 28. In other words, it would be desirable to conduct the process from FIGS. 3-4 ten times or more after the barrier layer 28 is formed in FIG. 2 and by doing so, the present invention ensures that no byproduct would remain between the barrier layer 28 and the conductive layer formed afterwards so that adhesion between the barrier layer 28 and the conductive layer would be unaffected.

Figure 5:
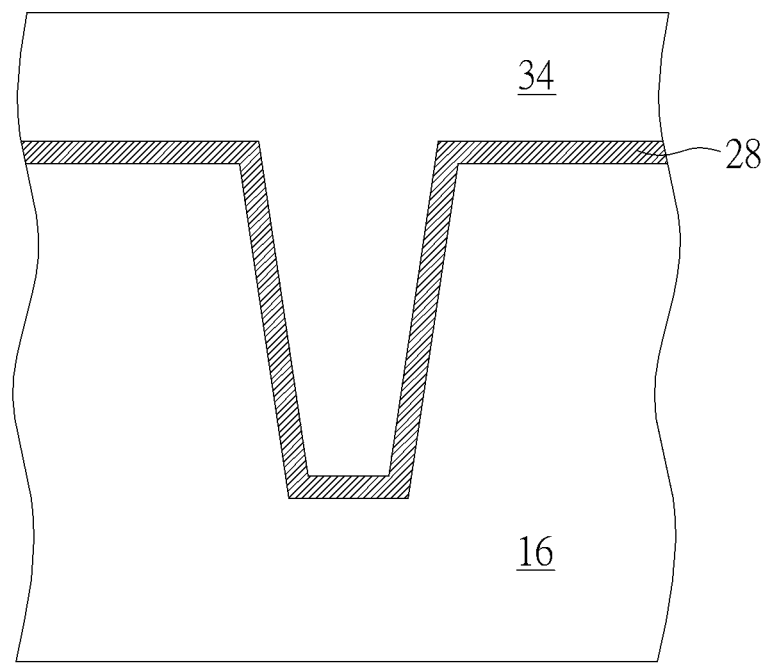

Next, as shown in FIG. 5, a conductive layer 34 is formed on the barrier layer 28, in which the conductive layer 34 preferably fills the trench 26 entirely. In this embodiment, the conductive layer 34 preferably includes tungsten (W), but not limited thereto.

Figure 6:
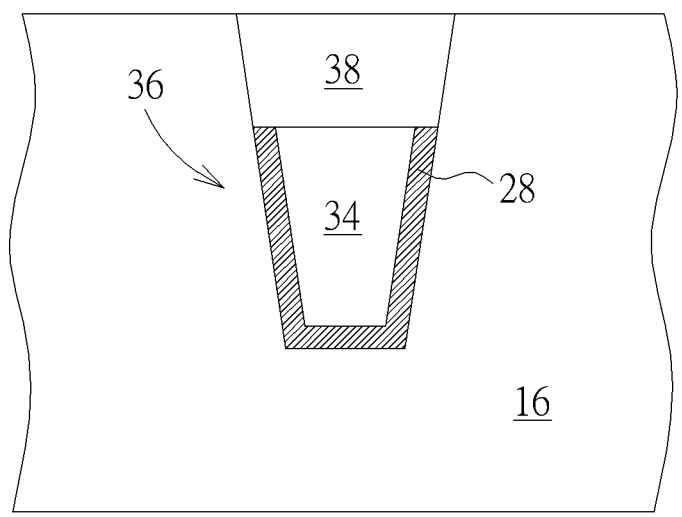

Next, as shown in FIG. 6, an etching back process is conducted to remove part of the conductive layer 34, part of the barrier layer 28, and part of the gate dielectric layer to form a gate structure 36 in the trench 26, in which the gate structure 36 preferably being the buried word line or word line 14 shown in FIG. 1. Next, a hard mask 38 is formed on the gate structure 36, in which the top surface of the hard mask 38 is even with the top surface of the substrate 16. In this embodiment, the hard mask 38 preferably includes silicon nitride (SiN), but not limited thereto.

Next, an ion implantation process could be conducted depending on the demand of the process to form a doped region (not shown) such as lightly doped drain or source/drain region in the substrate 16 adjacent to two sides of the gate structures 36. Next, a contact plug process could be conducted to form bit line contacts adjacent to two sides of the gate structures 36 electrically connecting the source/drain region and bit lines formed thereafter and storage node contacts electrically connecting the source/drain region and capacitors fabricated in the later process.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for fabricating a buried word line (BWL) of a dynamic random access memory (DRAM), comprising:
    forming a trench in a substrate;
    forming a barrier layer in the trench;
    performing a soaking process to reduce chlorine concentration in the barrier layer, wherein the soaking process comprises:
        a) performing an in-situ $NH_3$ soaking process by reacting $NH_3$ with a byproduct comprising $Ti(NH_2)Cl$; and
        b) performing a $N_2$ purge process; and
    forming a conductive layer to fill the trench.

2. The method of claim 1, further comprising:
    reacting a first reagent containing titanium with a second reagent containing nitrogen to form the barrier layer with the byproduct; and
    performing the soaking process to remove the byproduct.

3. The method of claim 2, wherein the first reagent comprises $TiCl_4$ and the second reagent comprises $NH_3$.

4. The method of claim 1, further comprising repeating the steps a) and b) for 10 times or more.

5. The method of claim 1, wherein the barrier layer comprises TiN.

6. The method of claim 1, wherein the conductive layer comprises tungsten (W).

* * * * *